(12) United States Patent
Takezoe et al.

(10) Patent No.: US 12,620,976 B2
(45) Date of Patent: May 5, 2026

(54) VARIABLE ATTENUATOR

(71) Applicant: Mitsubishi Electric Corporation, Tokyo (JP)

(72) Inventors: Shinji Takezoe, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 92 days.

(21) Appl. No.: 18/905,613

(22) Filed: Oct. 3, 2024

(65) Prior Publication Data

US 2025/0030405 A1 Jan. 23, 2025

Related U.S. Application Data

(63) Continuation of application No. PCT/JP2022/021037, filed on May 23, 2022.

(51) Int. Cl.
*H03H 11/24* (2006.01)
(52) U.S. Cl.
CPC ................................. *H03H 11/245* (2013.01)
(58) Field of Classification Search
CPC ........ H03H 11/245; H03H 7/25; H03H 11/24; H03H 7/24; H03H 11/02; H03H 17/0054; H03H 11/20; H03H 7/20; H03H 7/255; H03H 7/325; H03H 7/465; H01P 1/22; H01P 1/15; H01P 1/18; H03G 1/0088; H03G 2201/106; H03G 1/00; H03G 1/007; H03G 3/3036
See application file for complete search history.

(56) References Cited

U.S. PATENT DOCUMENTS 9,543,921 B2 * 1/2017 Kocer ...................... H03H 7/25

OTHER PUBLICATIONS

Cho et al., "A SiGe-BiCMOS Wideband Active Bidirectional Digital Step Attenuator With Bandwidth Tuning and Equalization". IEEE Transactions on Microwave Theory and Techniques, vol. 66, No. 8, Aug. 2018, pp. 3866-3876.
The International Search Report (PCT/ISA/210) issued in PCT/JP2022/021037, mailed on Aug. 16, 2022.
Extended European Search Report for European Application No. 22943636.5, dated May 14, 2025.

* cited by examiner

*Primary Examiner* — Lincoln D Donovan
*Assistant Examiner* — Tyler J Pereny
(74) *Attorney, Agent, or Firm* — Birch, Stewart, Kolasch & Birch, LLP

(57) ABSTRACT
A variable attenuator includes n attenuation resistor circuits and m adjustment resistor circuits connected in parallel to a signal line, the n attenuation resistor circuits are on-off controlled by corresponding attenuation amount control signals, each of the n attenuation resistor circuits being with a different attenuation amount, the adjustment resistor circuits correspond to k attenuation resistor circuits, and are on-off controlled by a signal of a logical product of k attenuation amount control signals for performing on-off control corresponding to each of the selected k attenuation resistor circuits, and when being on-controlled by a signal of a logical product of the k attenuation amount control signals, attenuation amount of the adjustment resistor circuits are made equal to a sum of attenuation amounts when the k attenuation resistor circuits controlled by the corresponding k attenuation amount control signals are independently on-controlled.

11 Claims, 4 Drawing Sheets

VARIABLE ATTENUATOR

CROSS REFERENCE TO RELATED APPLICATION

This application is a Continuation of PCT International Application No. PCT/JP2022/021037, filed on May 23, 2022, which is hereby expressly incorporated by reference into the present application.

TECHNICAL FIELD

The present disclosure relates to a variable attenuator.

BACKGROUND ART

In order to obtain a simple layout, a simplified switched T-type attenuator is proposed as an attenuator in Non Patent Literature 1.

The T-type attenuator disclosed in Non-Patent Literature 1 includes a shunt transistor and a shunt resistor connected in series between a signal line and a ground node.

CITATION LIST

Non Patent Literature

Non Patent Literature 1: MK Cho et al. "A SiGe-BiCMOS Wideband Active Bidirectional Digital Step Attenuator With Bandwidth Tuning and Equalization" IEEE Transactions on Microwave Theory and Techniques, Volume. 66, No 8, AUGUST. 2018

SUMMARY OF INVENTION

Technical Problem

In order to vary the attenuation amount using a plurality of T-type attenuators disclosed in Non-Patent Literature 1, it is necessary to perform on-off control of the shunt transistor of each T-type attenuator.

It is conceivable to use a logic circuit for on-off control of the shunt transistors of the plurality of T-type attenuators.

However, the logic circuit has a problem that a circuit configuration is complicated.

The present disclosure solves the above problem, and an object thereof is to obtain a variable attenuator having a simple circuit configuration without using a logic circuit.

Solution to Problem

A variable attenuator according to the present disclosure includes n attenuation resistor circuits and m adjustment resistor circuits connected in parallel to a signal line, in which the n attenuation resistor circuits are on-off controlled by corresponding attenuation amount control signals, each of the n attenuation resistor circuits exhibits a different attenuation amount when being independently on-controlled, the adjustment resistor circuits correspond to k attenuation resistor circuits selected from the n attenuation resistor circuits, and are on-off controlled by a signal of a logical product of k attenuation amount control signals for performing on-off control corresponding to each of the selected k attenuation resistor circuits, and when being on-controlled by a signal of a logical product of the k attenuation amount control signals, attenuation amount of the adjustment resistor circuits are made equal to a sum of attenuation amounts when the k attenuation resistor circuits controlled by the corresponding k attenuation amount control signals are independently on-controlled together with a sum of attenuation amounts by the selected k attenuation resistor circuits simultaneously on-controlled by the corresponding k attenuation amount control signals.

Advantageous Effects of Invention

According to the present disclosure, an attenuation amount width can be changed stepwise in three or more steps with a simple circuit configuration without providing a logic circuit for attenuation amount control.

BRIEF DESCRIPTION OF DRAWINGS

FIG. 1 is a circuit diagram illustrating a variable attenuator according to a first embodiment.

FIG. 2 is a schematic circuit diagram illustrating a variable attenuator according to a second embodiment.

DESCRIPTION OF EMBODIMENTS

First Embodiment

Figure 1:
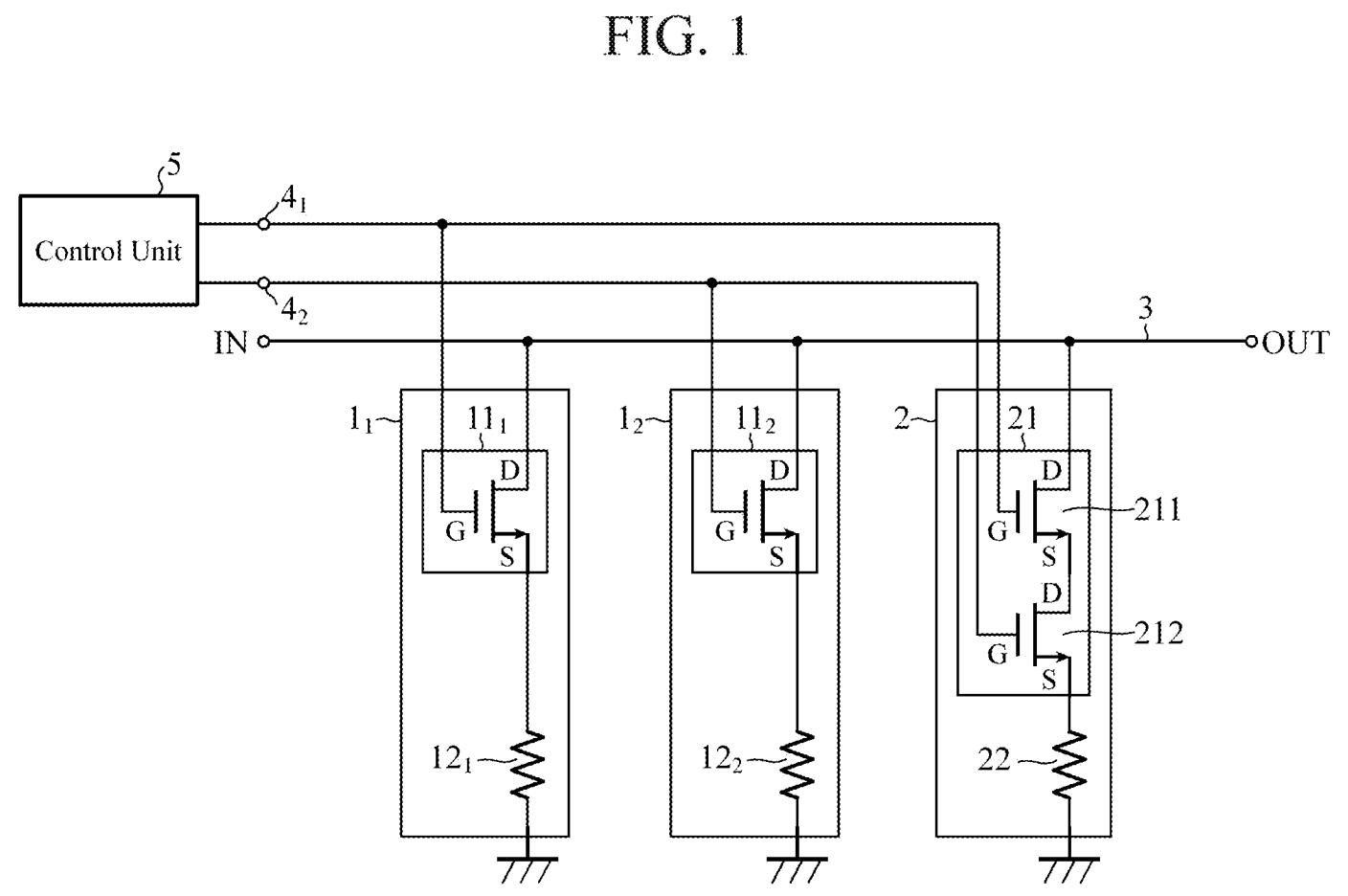
Figure 3:
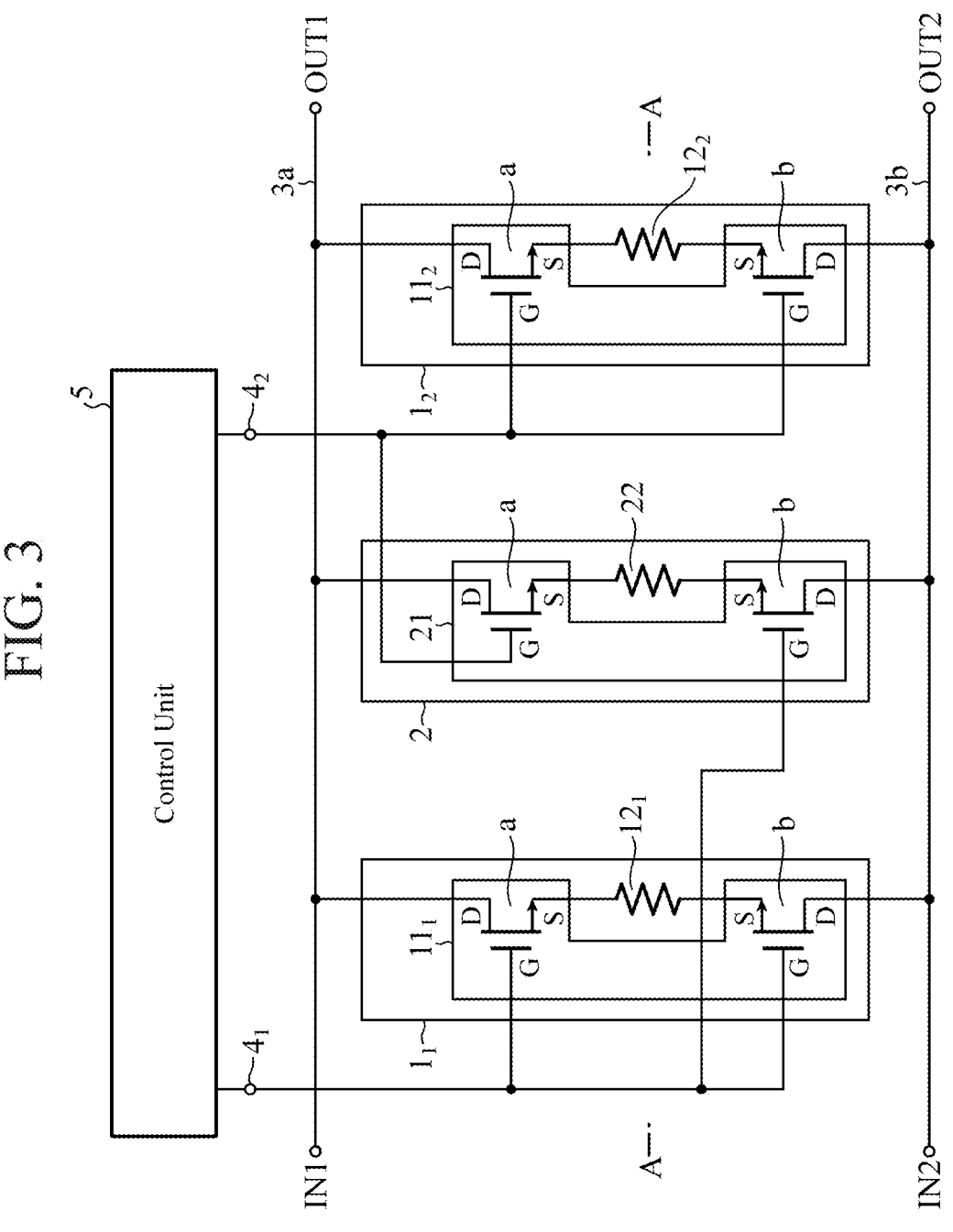
FIG. 3 is a circuit diagram illustrating a variable attenuator according to a third embodiment.

A variable attenuator according to a first embodiment will be described with reference to FIG. 1.

The variable attenuator according to the first embodiment is applied to a variable attenuator integrated on a gallium arsenide (GaAs) substrate.

The variable attenuator according to the first embodiment is a variable T-type attenuator having a plurality of attenuation amounts and having step widths of the plurality of attenuation amounts at equal intervals.

The variable attenuator according to the first embodiment includes n attenuation resistor circuits $1_1$ and $1_2$ with n being a natural number equal to or more than 2 and m adjustment resistor circuits $2$ with m being a natural number.

In the n attenuation resistor circuits $1_1$ and $1_2$, an N-th (N is a natural number from 1 to n) attenuation resistor circuit IN attenuates an attenuation amount of $2^{N-1}$ dB.

In the present disclosure, the attenuation amount of $2^{N-1}$ dB includes a technical range obtained by multiplying $2^{N-1}$ by a coefficient $\alpha$, and the coefficient will be described as 1 because it is complicated for description.

Each of the m adjustment resistor circuits $2$ corresponds to a selected plurality of attenuation resistor circuits among the n attenuation resistor circuits $1_1$ and $1_2$, and is adjusted in such a manner that a sum of attenuation amounts when the selected plurality of attenuation resistor circuits is enabled simultaneously is equal to a sum of attenuation amounts when the selected plurality of attenuation resistor circuits is enabled alone.

The variable attenuator according to the first embodiment has a most basic circuit configuration, and has three attenuation amounts with equal step widths.

That is, the variable attenuator according to the first embodiment is a variable attenuator in which n is 2, m is 1, and three attenuation amounts of 1 dB, 2 dB, and 3 dB are attenuated as an example, and a step width is equal to 1 dB.

The attenuation amount and the step width are given as examples, and are not limited to the examples.

The two attenuation resistor circuits $1_1$ and $1_2$ and the adjustment resistor circuit 2 are connected in parallel between a signal line 3 connecting an input terminal IN and an output terminal OUT of a signal and a ground node serving as a ground potential.

The first attenuation resistor circuit $1_1$ includes a switching unit $11_1$ and an attenuation resistor 121 connected in series from the signal line 3 toward the ground node.

The switching unit $11_1$ is on-off controlled by a first attenuation amount control signal input to a corresponding first control terminal $4_1$.

The first attenuation amount control signal is a binary signal indicating "1" (high level) or "0" (low level).

The switching unit $11_1$ is an N-MOS transistor which is a switching element.

Hereinafter, the switching unit $11_1$ will be described as the MOS transistor $11_1$.

The MOS transistor $11_1$ is turned on when the first attenuation amount control signal is "1" and turned off when the first attenuation amount control signal is "0".

A drain electrode which is one main electrode of the MOS transistor $11_1$ is connected to the signal line 3, a source electrode which is the other main electrode is connected to one end of the attenuation resistor $12_1$, and a gate electrode is connected to the first control terminal $4_1$.

The other end of the attenuation resistor $12_1$ is connected to a ground node.

The attenuation resistor $12_1$ is set to a resistance value that attenuates a level of a signal transmitted to the signal line 3 by 1 dB in this example when the MOS transistor $11_1$ is turned on and one end is connected to the signal line 3.

In the attenuation resistor $12_1$, a state in which the MOS transistor $11_1$ is turned on, one end is connected to the signal line 3, and the other end is connected to the ground node is hereinafter referred to as a state in which the attenuation resistor $12_1$ is enabled.

The second attenuation resistor circuit $1_2$ includes a switching unit $11_2$ and an attenuation resistor $12_2$ connected in series from the signal line 3 toward the ground node.

The switching unit $11_2$ is on-off controlled by a second attenuation amount control signal input to the corresponding second control terminal $4_2$.

The second attenuation amount control signal is a binary signal indicating "1" or "0".

The switching unit $11_2$ is an N-MOS transistor which is a switching element.

The MOS transistor $11_2$ is turned on when the second attenuation amount control signal is "1" and turned off when the second attenuation amount control signal is "0".

A drain electrode which is one main electrode of the MOS transistor $11_2$ is connected to the signal line 3, a source electrode which is the other main electrode is connected to one end of the attenuation resistor $12_2$, and a gate electrode is connected to the second control terminal $4_2$.

The other end of the attenuation resistor $12_2$ is connected to a ground node.

When the MOS transistor $11_2$ is turned on and one end thereof is connected to the signal line 3, the level of the signal transmitted to the signal line 3 is attenuated by an attenuation amount of $(2^{n-1})$ dB and n is 2 in this example, and therefore, the attenuation resistor $12_2$ is set to a resistance value that attenuates the signal transmitted to the signal line 3 by twice the resistance value of the attenuation resistor $12_1$ in decibels, that is, by 2 dB.

In the attenuation resistor $12_2$, a state in which the MOS transistor $11_2$ is turned on, one end is connected to the signal line 3, and the other end is connected to the ground node is hereinafter referred to as a state in which the attenuation resistor $12_2$ is enabled.

When the attenuation resistor $12_1$ and the attenuation resistor 122 are enabled, the adjustment resistor circuit 2 performs attenuation amount adjustment to be equal to the sum of the attenuation amounts when the attenuation resistor $12_1$ and the attenuation resistor $12_2$ are enabled alone.

When the attenuation resistor $12_1$ and the attenuation resistor $12_2$ are enabled at the same time, since the attenuation resistor $12_1$ and the attenuation resistor $12_2$ are connected in parallel, attenuation of 3 dB ($=1$ dB$+2$ dB), which is the sum of both attenuation amounts, cannot be simply obtained, and the level of the signal transmitted to the signal line 3 is attenuation of less than 3 dB.

The adjustment resistor circuit 2 is a circuit that performs adjustment to 3 dB when the attenuation resistor $12_1$ and the attenuation resistor $12_2$ are enabled at the same time.

The adjustment resistor circuit 2 includes a switching unit 21 and an adjustment resistor 22 connected in series from the signal line 3 toward the ground node.

The switching unit 21 is on-off controlled by a signal of a logical product of the first attenuation amount control signal and the second attenuation amount control signal input to the attenuation resistor circuits $1_1$ and $1_2$ enabled at the same time.

That is, when both the first attenuation amount control signal and the second attenuation amount control signal are "1", the switching unit is in a conductive state between both ends, that is, turned on, and when at least one of the first attenuation amount control signal or the second attenuation amount control signal is "0", the switching unit 21 is in a non-conductive state between both ends, that is, turned off. The switching unit 21 is configured by connecting the same number of N-MOS transistors $21_1$ and $21_2$ as the number of the attenuation resistor circuits $1_1$ and $1_2$ enabled at the same time, that is, two switching elements in series.

A drain electrode which is one main electrode of one MOS transistor $21_1$ is connected to the signal line 3, a source electrode which is the other main electrode is connected to a drain electrode which is one main electrode of the other MOS transistor $21_2$, and a gate electrode is connected to the first control terminal $4_1$ to which the MOS transistor $11_1$ of the attenuation resistor circuit $1_1$ is connected.

The source electrode, which is the other main electrode of the other MOS transistor $21_2$, is connected to one end of the adjustment resistor 22, and the gate electrode is connected to the second control terminal $4_2$ to which the MOS transistor $11_2$ of the attenuation resistor circuit $1_2$ is connected.

The other end of the adjustment resistor 22 is connected to a ground node.

When the MOS transistor $21_1$ and the MOS transistor $21_2$ are turned on, that is, the switching unit 21 is brought into a conductive state, one end of the adjustment resistor 22 is connected to the signal line.

At this time, the MOS transistor $11_1$ is turned on, and one end of the attenuation resistor $12_1$ is connected to the signal line 3, and the MOS transistor $11_2$ is turned on, and one end of the attenuation resistor $12_2$ is connected to the signal line 3.

In other words, only when both the MOS transistor $11_2$ and the MOS transistor $11_2$ are turned on and both the attenuation resistor $12_1$ and the attenuation resistor $12_2$ are connected to the signal line 3, the adjustment resistor 22 is connected to the signal line 3.

The resistance value of the adjustment resistor 22 is set to a resistance value that attenuates the level of the signal transmitted to the signal line 3 by an attenuation amount that is equal to the sum of attenuation amounts when the attenuation resistor 12₁ and the attenuation resistor 12₂ are enabled alone, that is, 3 dB in this example by the attenuation resistor 12₁ and the attenuation resistor 12₂ connected to the signal line 3.

In short, when the attenuation resistor 12₁ and the attenuation resistor 12₂ are enabled by being controlled by the first attenuation amount control signal and the second attenuation amount control signal, the resistance value of the adjustment resistor 22 is adjusted to be equal to the sum of the attenuation amounts when the attenuation resistor 12₁ and the attenuation resistor 12₂ are enabled alone, and as a result, the attenuation amount is set to a resistance value at which the attenuation amount is set at equal intervals.

That is, in the variable attenuator according to the first embodiment, the level of the signal transmitted to the signal line 3 can be changed stepwise in three steps with the step width of the attenuation amount at equal intervals.

A first attenuation amount control signal is input from the control unit 5 to the first control terminal 4₁.

A second attenuation amount control signal is input from the control unit 5 to the second control terminal 4₂.

Note that the transistor constituting each switching unit may be a P-MOS transistor instead of an N-MOS transistor. In the case of the P-MOS transistor, the relationship between the high level and the low level of each attenuation amount control signal with respect to the on-off control is reversed.

Next, the operation of the variable attenuator according to the first embodiment will be described.

As a first operation mode, a case where the first attenuation amount control signal input from the control unit 5 to the first control terminal 4₁ is "1" and the second attenuation amount control signal input to the second control terminal 4₂ is "0" will be described.

The first operation mode is an operation mode in which the variable attenuator attenuates the level of the signal transmitted to the signal line 3 by 1 dB.

When the first attenuation amount control signal is "1", the MOS transistor 11₁ is turned on, and when the second attenuation amount control signal is "0", the MOS transistor 11₂ and the MOS transistor 21₂ are turned off.

As a result, only the attenuation resistor 12₁ is connected to the signal line 3, the attenuation resistor 12₂ and the adjustment resistor 22 are not connected to the signal line 3, and the level of the signal transmitted to the signal line 3 is attenuated by 1 dB in this example.

As a second operation mode, a case where the first attenuation amount control signal input from the control unit 5 to the first control terminal 4₁ is "0" and the second attenuation amount control signal input to the second control terminal 4₂ is "1" will be described.

The second operation mode is an operation mode in which the variable attenuator attenuates the level of the signal transmitted to the signal line 3 by 2 dB.

When the second attenuation amount control signal is "1", the MOS transistor 11₂ is turned on, and when the first attenuation amount control signal is "0", the MOS transistor 11₁ and the MOS transistor 21₁ are turned off.

As a result, only the attenuation resistor 12₂ is connected to the signal line 3, the attenuation resistor 12₁ and the adjustment resistor 22 are not connected to the signal line 3, and the level of the signal transmitted to the signal line 3 is attenuated by 2 dB in this example.

As a third operation mode, a case where the first attenuation amount control signal input from the control unit 5 to the first control terminal 4₁ is "1" and the second attenuation amount control signal input to the second control terminal 42 is "1" will be described.

The third operation mode is an operation mode in which the variable attenuator attenuates the level of the signal transmitted to the signal line 3 by 3 dB.

When the first attenuation amount control signal is "1" and the second attenuation amount control signal is "1", the MOS transistor 11₁, the MOS transistor 11₂, the MOS transistor 21₁, and the MOS transistor 21₂ are turned on.

As a result, the attenuation resistor 12₁, the attenuation resistor 12₂, and the adjustment resistor 22 are connected to the signal line 3, and the level of the signal transmitted to the signal line 3 is attenuated by 3 dB in this example.

That is, the level of the signal transmitted to the signal line 3 is attenuated by an attenuation amount of 1 dB in the first operation mode, an attenuation amount of 2 dB having a step width of 1 dB with respect to the first operation mode in the second operation mode, and an attenuation amount of 3 dB having a step width of 1 dB with respect to the second operation mode in the third operation mode.

In short, the variable attenuator according to the first embodiment is controlled by the first attenuation amount control signal and the second attenuation amount control signal to achieve an attenuation amount at equal intervals with a step width of 1 dB from 1 dB to 3 dB.

As described above, the variable attenuator according to the first embodiment includes the two attenuation resistor circuits 1₁ and 1₂ and the one adjustment resistor circuit 2, the two attenuation resistor circuits 1₁ and 1₂ are on-off controlled by the respective corresponding first attenuation amount control signal and second attenuation amount control signal, the adjustment resistor circuit 2 is on-off controlled by a signal of a logical product of the first attenuation amount control signal and the second attenuation amount control signal, and the sum of the attenuation amounts when the attenuation resistors 12₁ and 12₂ in the two attenuation resistor circuits 1₁ and 1₂ are enabled is adjusted, so that the step width of the attenuation amount can be changed stepwise in three steps at equal intervals by a simple circuit configuration without providing a logic circuit for the attenuation amount control.

Further, since the circuit configuration is simple, it can be easily integrated on a GaAs substrate.

Second Embodiment

A variable attenuator according to a second embodiment will be described with reference to FIG. 2.

Figure 2:
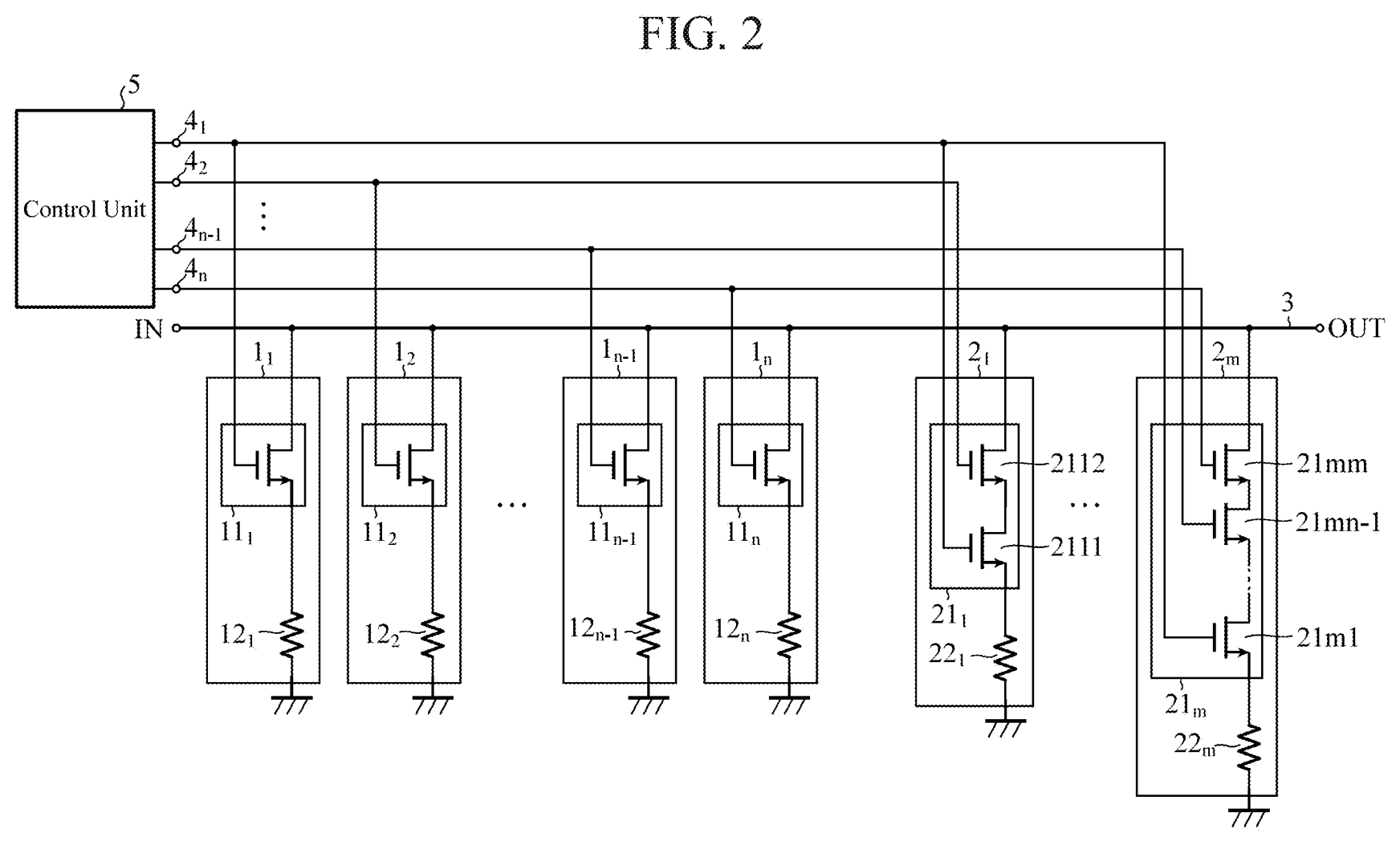

In FIG. 2, the same reference signs as those in FIG. 1 denote the same or corresponding parts.

The variable attenuator according to the second embodiment is applied to a variable attenuator integrated on a gallium arsenide (GaAs) substrate.

A variable attenuator according to the second embodiment is a variable T-type attenuator having a plurality of attenuation amounts and having step widths of the plurality of attenuation amounts at equal intervals.

The variable attenuator according to the second embodiment includes n, which is a natural number equal to or more than 2, attenuation resistor circuits 1₁ to 1ₙ, and m, which is ($2^n-1-n$), adjustment resistor circuits 2₁ to 2ₘ.

In the n attenuation resistor circuits 1₁ to 1ₙ, an N-th (N is a natural number from 1 to n) attenuation resistor circuit 1N attenuates an attenuation amount of $2^{N-1}$ dB as a level of a signal transmitted to the signal line 3.

In the present disclosure, the attenuation amount of $2^{N-1}$ dB includes a technical range obtained by multiplying $2^{N-1}$ by the coefficient $\alpha$, and the coefficient will be described as 1 because it is complicated for description.

Each of the m adjustment resistor circuits $2_1$ to $2_m$ corresponds to a plurality of attenuation resistor circuits selected among the n attenuation resistor circuits $1_1$ to $1_n$, and adjusts the sum of the attenuation amounts when the selected plurality of attenuation resistor circuits is enabled simultaneously to be equal to the sum of the attenuation amounts when the selected plurality of attenuation resistor circuits is enabled alone.

Note that, in the following description, when content common to the attenuation resistor circuits is described in the n attenuation resistor circuits $1_1$ to $1_n$, the description will be simply given as the attenuation resistor circuit 1 without adding a subscript, in order to avoid complication of the description.

Further, when content common to the adjustment resistor circuits is described in the m adjustment resistor circuits $2_1$ to $2_m$, the description will be simply given as the adjustment resistor circuit 2 without adding a subscript, in order to avoid complication of the description.

As an example, the variable attenuator according to the second embodiment is a variable attenuator having an equal step width of 1 dB and the number of changes in the attenuation amount of $[n+(2^n-1-n)]$.

The step width is given as an example, and is not limited to the example.

The n attenuation resistor circuits 1 and the m adjustment resistor circuits 2 are connected in parallel between the signal line 3 connecting an input terminal IN and an output terminal OUT of a signal and a ground node serving as a ground potential.

In FIG. 2, a first attenuation resistor circuit $1_1$, a second attenuation resistor circuit $1_2$, . . . , a (n−1)-th attenuation resistor circuit $1_{n-1}$, and an n-th attenuation resistor circuit $1_n$ are illustrated as examples of the n attenuation resistor circuits 1, and a first adjustment resistor circuit $2_1$, . . . , and an m-th adjustment resistor circuit $2_m$ are illustrated as examples of the m adjustment resistor circuits 2.

Each attenuation resistor circuit 1 includes a switching unit 11 and an attenuation resistor 12 connected in series from the signal line 3 toward the ground node.

The switching unit 11 is on-off controlled by an attenuation amount control signal input to the corresponding control terminal 4.

Each attenuation amount control signal is a binary signal indicating "1" (high level) or "0" (low level).

The switching unit 11 is an N-MOS transistor which is a switching element.

Hereinafter, the switching unit 11 will be described as the MOS transistor 11.

The MOS transistor 11 is turned on when the input attenuation amount control signal is "1", and turned off when the input attenuation amount control signal is "0".

A drain electrode which is one main electrode of the MOS transistor 11 is connected to the signal line 3, a source electrode which is the other main electrode is connected to one end of the attenuation resistor 12, and a gate electrode is connected to the corresponding control terminal 4.

The other end of the attenuation resistor 12 is connected to a ground node.

The attenuation resistor 12 is set to a resistance value that attenuates the level of the signal transmitted to the signal line 3 when the MOS transistor 11 connected in series is turned on and one end is connected to the signal line 3.

In this example, the resistance value of the attenuation resistor $12_N$ of the N-th (N is 1 to n) attenuation resistor circuit IN is set to a resistance value that attenuates the level of the signal transmitted to the signal line 3 by $2^{N-1}$ dB when being independently on-controlled by the N-th attenuation amount control signal.

In the attenuation resistor 12, a state in which the MOS transistor 11 connected in series is turned on, one end is connected to the signal line 3, and the other end is connected to the ground node is hereinafter referred to as a state in which the attenuation resistor 12 is enabled.

When the attenuation resistor 12 is enabled independently, the first attenuation resistor circuit $1_1$ to the n-th attenuation resistor circuit $1_n$ attenuate levels of signals transmitted to the signal line 3 by attenuation amounts of 1 dB, 2 dB, 4 dB, 8 dB, . . . , $2^{n-1}$ dB in this order.

Each adjustment resistor circuit 2 corresponds to k attenuation resistor circuits 1 selected from the n attenuation resistor circuits 1, and is on-off controlled by a signal of a logical product of k attenuation amount control signals for on-off control corresponding to each of the selected k attenuation resistor circuits 1.

When being on-controlled by a signal of a logical product of k attenuation amount control signals, attenuation amount of the adjustment resistor circuits 2 are made to be equal to the sum of attenuation amounts when the k attenuation resistor circuits 1 controlled by the corresponding k attenuation amount control signals are independently on-controlled together with the attenuation amounts of the k attenuation resistor circuits 1 simultaneously on-controlled by the corresponding k attenuation amount control signals.

$(2^{N-2}-1)$ adjustment resistor circuits 2 are provided to adjust an attenuation amount from an attenuation amount of $2^{N-2}$ dB by the (N−1)-th attenuation resistor circuit 1 to an attenuation amount of $2^{N-1}$ dB by the N-th attenuation resistor circuit by using the same step width.

Each of the $(2^{N-2}-1)$ adjustment resistor circuits 2 corresponds to one combination of two or more combinations of two or more attenuation resistor circuits 1 up to the N-th attenuation resistor circuit $1_N$.

That is, in order to adjust the attenuation amount from the attenuation amount of 2 dB by the second attenuation resistor circuit $1_2$ to the attenuation amount of 4 dB by the third attenuation resistor circuit $1_3$ by a step width of 1 dB, there is a first adjustment resistor circuit $2_1$ corresponding to a combination of the first attenuation resistor circuit $1_1$ and the second attenuation resistor circuit $1_2$.

The first adjustment resistor circuit $2_1$ is on-off controlled by a signal of a logical product of a first attenuation amount control signal for the first attenuation resistor circuit $1_1$ and a second attenuation amount control signal for the second attenuation resistor circuit $1_2$, and is on controlled when the first attenuation resistor circuit $1_1$ and the second attenuation resistor circuit $1_2$ are on controlled by the first attenuation amount control signal and the second attenuation amount control signal.

When the first attenuation resistor circuit $1_1$, the second attenuation resistor circuit $1_2$, and the first adjustment resistor circuit $2_1$ are on-controlled, an attenuation amount of 3 dB equal to the attenuation amount of 3 dB that is the sum of the attenuation amounts when the first attenuation resistor circuit $1_1$ and the second attenuation resistor circuit $1_2$ are independently on-controlled is attenuated from the level of the signal transmitted to the signal line 3.

In order to adjust the attenuation amount from the attenuation amount of 4 dB by the third attenuation resistor circuit $1_3$ to the attenuation amount of 8 dB by the fourth attenuation resistor circuit $1_4$ by a step width of 1 dB, there are the second adjustment resistor circuit $2_2$ to the fourth adjustment resistor circuit $2_4$ corresponding to one combination of two or more combinations selected from the attenuation resistor circuits from the first attenuation resistor circuit $1_1$ to the third (=4−1) attenuation resistor circuit $1_3$.

Since the width of the attenuation amount is 4 dB from the attenuation amount 4 dB by the third attenuation resistor circuit $1_3$ to the attenuation amount 8 dB by the fourth attenuation resistor circuit $1_4$, there are three (=$2^{4-2}$−1) adjustment resistor circuits 2 in order to set the step width to 1 dB.

The second adjustment resistor circuit $2_2$ is the adjustment resistor circuit 2 for adjusting the attenuation amount to 5 dB, and is on-off controlled by a signal of a logical product of a first attenuation amount control signal for the first attenuation resistor circuit $1_1$ and a third attenuation amount control signal for the third attenuation resistor circuit $1_3$, and is on controlled when the first attenuation resistor circuit $1_1$ (independent attenuation amount of 1 dB) and the third attenuation resistor circuit $1_3$ (independent attenuation amount of 4 dB) are on controlled by the first attenuation amount control signal and the third attenuation amount control signal.

The third adjustment resistor circuit $2_3$ is the adjustment resistor circuit 2 for adjusting the attenuation amount to 6 dB, is on-off controlled by a signal of a logical product of a second attenuation amount control signal for the second attenuation resistor circuit $1_2$ and a third attenuation amount control signal for the third attenuation resistor circuit $1_3$, and is on controlled when the second attenuation resistor circuit $1_2$ (independent attenuation amount of 2 dB) and the third attenuation resistor circuit $1_3$ (independent attenuation amount of 4 dB) are on controlled by the second attenuation amount control signal and the third attenuation amount control signal.

The fourth adjustment resistor circuit $2_4$ is the adjustment resistor circuit 2 for adjusting the attenuation amount to 7 dB, is on-off controlled by a signal of a logical product of a first attenuation amount control signal for the first attenuation resistor circuit $1_1$, a second attenuation amount control signal for the second attenuation resistor circuit $1_2$, and a third attenuation amount control signal for the third attenuation resistor circuit $1_3$, and is on-controlled when the first attenuation resistor circuit $1_1$ (independent attenuation amount of 1 dB), the second attenuation resistor circuit $1_2$ (independent attenuation amount of 2 dB), and the third attenuation resistor circuit $1_3$ (independent attenuation amount of 4 dB) are on controlled by the first attenuation amount control signal to the third attenuation amount control signal.

In order to adjust the attenuation amount from the attenuation amount of 8 dB by the fourth attenuation resistor circuit $1_4$ to the attenuation amount of 16 dB by the fifth attenuation resistor circuit $1_5$ by a step width of 1 dB, there are the fifth adjustment resistor circuit $2_5$ to the eleventh adjustment resistor circuit $2_{11}$ corresponding to one combination of two or more combinations selected from the attenuation resistor circuits from the first attenuation resistor circuit $1_1$ to the fourth (=5−1) attenuation resistor circuit $1_4$.

Since the width of the attenuation amount is 7 dB from the attenuation amount of 8 dB by the fourth attenuation resistor circuit $1_4$ to the attenuation amount of 16 dB by the fifth attenuation resistor circuit $1_5$, there are 7 (=$2^{5-2}$−1) adjustment resistor circuits 2 in order to set the step width to 1 dB.

The fifth adjustment resistor circuit $2_5$ is the adjustment resistor circuit 2 for adjusting the attenuation amount to 9 dB, corresponds to the first attenuation resistor circuit $1_1$ (independent attenuation amount of 1 dB) and the fourth attenuation resistor circuit $1_4$ (independent attenuation amount of 8 dB), and is on-controlled when the first attenuation resistor circuit $1_1$ and the fourth attenuation resistor circuit $1_4$ are on-controlled.

The sixth adjustment resistor circuit $2_6$ is the adjustment resistor circuit 2 for adjusting the attenuation amount to 10 dB, corresponds to the second attenuation resistor circuit $1_2$ (independent attenuation amount of 2 dB) and the fourth attenuation resistor circuit $1_4$ (independent attenuation amount of 8 dB), and is on-controlled when the second attenuation resistor circuit $1_2$ and the fourth attenuation resistor circuit $1_4$ are on-controlled.

The seventh adjustment resistor circuit $2_7$ is the adjustment resistor circuit 2 for adjusting the attenuation amount to 11 dB, corresponds to the first attenuation resistor circuit $1_1$ (independent attenuation amount of 1 dB), the second attenuation resistor circuit $1_2$ (independent attenuation amount of 2 dB), and the fourth attenuation resistor circuit $1_4$ (independent attenuation amount of 8 dB), and is on-controlled when the first attenuation resistor circuit $1_1$, the second attenuation resistor circuit $1_2$, and the fourth attenuation resistor circuit $1_4$ are on-controlled.

The eighth adjustment resistor circuit $2_8$ is the adjustment resistor circuit 2 for adjusting the attenuation amount to 12 dB, corresponds to the third attenuation resistor circuit $1_3$ (independent attenuation amount of 4 dB) and the fourth attenuation resistor circuit $1_4$ (independent attenuation amount of 8 dB), and is on-controlled when the third attenuation resistor circuit $1_3$ and the fourth attenuation resistor circuit $1_4$ are on-controlled.

The ninth adjustment resistor circuit $2_9$ is the adjustment resistor circuit 2 for adjusting the attenuation amount to 13 dB, corresponds to the first attenuation resistor circuit $1_1$ (independent attenuation amount of 1 dB), the third attenuation resistor circuit $1_3$ (independent attenuation amount of 4 dB), and the fourth attenuation resistor circuit $1_4$ (independent attenuation amount of 8 dB), and is on-controlled when the first attenuation resistor circuit $1_1$, the third attenuation resistor circuit $1_3$, and the fourth attenuation resistor circuit $1_4$ are on-controlled.

The tenth adjustment resistor circuit $2_{10}$ is the adjustment resistor circuit 2 for adjusting the attenuation amount to 14 dB, corresponds to the second attenuation resistor circuit $1_2$ (independent attenuation amount of 2 dB), the third attenuation resistor circuit $1_3$ (independent attenuation amount of 4 dB), and the fourth attenuation resistor circuit $1_4$ (independent attenuation amount of 8 dB), and is on-controlled when the second attenuation resistor circuit $1_2$, the third attenuation resistor circuit $1_3$, and the fourth attenuation resistor circuit $1_4$ are on-controlled.

The eleventh adjustment resistor circuit $2_{11}$ is the adjustment resistor circuit 2 for adjusting the attenuation amount to 15 dB, corresponds to the first attenuation resistor circuit $1_1$ (independent attenuation amount of 1 dB), the second attenuation resistor circuit $1_2$ (independent attenuation amount of 2 dB), the third attenuation resistor circuit $1_3$ (independent attenuation amount of 4 dB), and the fourth attenuation resistor circuit $1_4$ (independent attenuation amount of 8 dB), and is on-controlled when the first attenuation resistor circuit $1_1$, the second attenuation resistor circuit $1_2$, the third attenuation resistor circuit $1_3$, and the fourth attenuation resistor circuit $1_4$ are on-controlled.

That is, in order to adjust the attenuation amount from the attenuation amount of $2^{N-2}$ dB by the (N−1)-th attenuation resistor circuit to the attenuation amount of $2^{N-1}$ dB by the N-th attenuation resistor circuit with the same step width of 1 dB, there are $(2^{N-2}-1)$ adjustment resistor circuits 2 corresponding to one combination of two or more combinations selected from the attenuation resistor circuits from the first attenuation resistor circuit $\mathbf{1}_1$ to the (N−1)-th attenuation resistor circuit $\mathbf{1}_{N-1}$.

As a result, the number m of the adjustment resistor circuits 2 is $(2^n-1-n)$.

Each adjustment resistor circuit 2 includes a switching unit 21 and an attenuation resistor 22 connected in series from the signal line 3 toward the ground node.

The switching unit 21 in each adjustment resistor circuit 2 corresponds to the k attenuation resistor circuits 1 selected from the n attenuation resistor circuits 1, and is on-off controlled by a signal of a logical product of k attenuation amount control signals for on-off control corresponding to each of the selected k attenuation resistor circuits 1.

When the k attenuation amount control signals for the corresponding selected k attenuation resistor circuits 1 are both "1", the switching unit 21 is in a conductive state between both ends, that is, turned on, and when at least one of the k attenuation amount control signals is "0", the switching unit is in a non-conductive state between both ends, that is, turned off.

The switching unit 21 includes a series body in which N-MOS transistors, which are k switching elements, are connected in series corresponding to the k attenuation resistor circuits 1.

In FIG. 2, the reference signs of the MOS transistors in each adjustment resistor circuit 2 are, for convenience, 2111 for the MOS transistor in which the gate electrode in the first adjustment resistor circuit $\mathbf{2}_1$ is connected to the control terminal $\mathbf{4}_1$, and 21m1 for the MOS transistor in which the gate electrode in the m-th adjustment resistor circuit $\mathbf{2}_m$ is connected to the first control terminal $\mathbf{4}_1$, together with the control terminal 4 to which the gate electrode is connected, for example.

Note that, in the following description, it will be described simply as a MOS transistor because it becomes complicated.

Each adjustment resistor circuit 2 corresponds to one combination of two or more combinations selected from the n attenuation resistor circuits 1, and thus the number k of MOS transistors is a natural number from 2 to n corresponding to the selected two or more combinations.

That is, in the m adjustment resistor circuits 2, the switching unit 21 can be classified by a group of 2 MOS transistors, a group of 3 MOS transistors, . . . , n MOS transistors, and the number of MOS transistors.

The adjustment resistor circuit 2 is configured by a series body of a number of MOS transistors based on a combination of the attenuation resistor circuits 1 that are simultaneously on-controlled like, for example, the first adjustment resistor circuit $\mathbf{2}_1$ for adjusting the attenuation amount of 3 dB described above being configured by two MOS transistors, the second adjustment resistor circuit $\mathbf{2}_2$ for adjusting the attenuation amount of 5 dB being configured by two MOS transistors, the third adjustment resistor circuit $\mathbf{2}_3$ for adjusting the attenuation amount of 6 dB being configured by two MOS transistors, the fourth adjustment resistor circuit $\mathbf{2}_4$ for adjusting the attenuation amount of 7 dB being configured by three MOS transistors, . . . , and the m-th adjustment resistor circuit $\mathbf{2}_m$ being configured by a series body of n MOS transistors.

In each adjustment resistor circuit 2, one end of a series body including k MOS transistors constituting the switching unit 21, that is, the drain electrode of the MOS transistor on the signal line 3 side is connected to the signal line 3, and the gate electrode of each MOS transistor is connected to the control terminal 4 to which the corresponding selected attenuation resistor circuit 1 is connected.

The other end of the series body, that is, the source electrode of the MOS transistor on an opposite side of the signal line 3 is connected to one end of the adjustment resistor 22.

The other end of the adjustment resistor 22 is connected to a ground node.

In the adjustment resistor 22, when all the k MOS transistors constituting the switching unit 21 are turned on, that is, when the switching unit 21 is in a conductive state, one end of the series body is connected to the signal line.

At this time, the MOS transistors 11 of the k attenuation resistor circuits 1 corresponding to the adjustment resistor circuit 2 are turned on, and one end of the attenuation resistor 12 is connected to the signal line 3.

In other words, only when all the MOS transistors 11 of the k attenuation resistor circuits 1 are turned on and all the attenuation resistors 12 of the k attenuation resistor circuits 1 are connected to the signal line 3, the adjustment resistor 22 is connected to the signal line 3.

The resistance value of each adjustment resistor 22 is set to a resistance value that attenuates an attenuation amount that is equal to the sum of attenuation amounts in a case where the k attenuation resistors 12 are enabled alone when the attenuation resistors 12 in the corresponding k attenuation resistor circuits 1 are enabled at the same time.

As a result, in the variable attenuator according to the second embodiment, the level of the signal transmitted to the signal line 3 can be changed stepwise in $[n+(2^n-1-n)]$ steps with the step width of the attenuation amount at equal intervals.

From the first control terminal $\mathbf{4}_1$ to the n-th control terminal $\mathbf{4}_n$, the first attenuation amount control signal to the n-th attenuation amount control signal are input from the control unit 5.

Note that the transistor constituting each switching unit may be a P-MOS transistor instead of an N-MOS transistor. In the case of the P-MOS transistor, the relationship between the high level and the low level of each attenuation amount control signal with respect to the on-off control is reversed.

Next, the operation of the variable attenuator according to the second embodiment will be described.

The operations of the attenuation resistor circuit 1 and the adjustment resistor circuit 2 will be described for each attenuation amount.

Note that, in order to avoid complication of the description, a case where the attenuation resistor circuit 1 is enabled assumes that the attenuation resistor is enabled, a case where the adjustment resistor circuit 2 is enabled assumes that the adjustment resistor is enabled, and only the enabled circuit will be described below. When a resistor is enabled, it means that the MOS transistor connected in series to the resistor is turned on by the attenuation amount control signal, and a resistor that is not enabled means that at least one MOS transistor connected in series to the resistor is turned off by the corresponding attenuation amount control signal.

When the attenuation amount is 1 dB, the first attenuation resistor circuit $\mathbf{1}_1$ is enabled.

When the attenuation amount is 2 dB, the second attenuation resistor circuit $\mathbf{1}_2$ is enabled.

When the attenuation amount is 3 dB, the first attenuation resistor circuit $\mathbf{1}_1$, the second attenuation resistor circuit $\mathbf{1}_2$, and the first adjustment resistor circuit $\mathbf{2}_1$ are enabled.

When the attenuation amount is 4 dB, the third attenuation resistor circuit $\mathbf{1}_3$ is enabled.

When the attenuation amount is 5 dB, the first attenuation resistor circuit $1_1$, the third attenuation resistor circuit $1_3$, and the second adjustment resistor circuit $2_2$ are enabled.

When the attenuation amount is 6 dB, the second attenuation resistor circuit $1_2$, the third attenuation resistor circuit $1_3$, and the third adjustment resistor circuit $2_3$ are enabled.

When the attenuation amount is 7 dB, the first attenuation resistor circuit $1_1$, the second attenuation resistor circuit $1_2$, the third attenuation resistor circuit $1_3$, and the fourth adjustment resistor circuit $2_4$ are enabled.

When the attenuation amount is 8 dB, the fourth attenuation resistor circuit $1_4$ is enabled.

When the attenuation amount is 9 dB, the first attenuation resistor circuit $1_1$, the fourth attenuation resistor circuit $1_4$, and the fifth adjustment resistor circuit $2_5$ are enabled.

When the attenuation amount is 10 dB, as continued, the attenuation resistor circuit 1 is selected depending on the attenuation amount, and when a plurality of attenuation resistor circuits 1 is enabled simultaneously, the adjustment resistor circuit 2 corresponding to the selected attenuation resistor circuit 1 is enabled, and when the attenuation amount is $[n+(2^n-1-n)]$ dB, all of the first attenuation resistor circuit $1_1$ to the n-th attenuation resistor circuits $1_n$ and the m-th adjustment resistor circuit $2_m$ are enabled.

In short, the variable attenuator according to the second embodiment is controlled by the first attenuation amount control signal to the n-th attenuation amount control signal, and implements an attenuation amount at equal intervals with a step width of 1 dB from 1 dB to $[n+(2^n-1-n)]$ dB.

As described above, the variable attenuator according to the second embodiment includes the n attenuation resistor circuits $1_1$ to $1_n$ and the m adjustment resistor circuits $2_1$ to $2_m$, the n attenuation resistor circuits $1_1$ to $1_n$ are on-off controlled by the respective corresponding first attenuation amount control signal to n-th attenuation amount control signal, the attenuation amount when each of the attenuation resistor circuits $1_1$ to $1_n$ is independently on-controlled is $2^{N-1}$ (N is 1 to n) dB, the m adjustment resistor circuits 2 include the $(2^{N-2}-1)$ adjustment resistor circuits that adjust the attenuation amount from the attenuation amount of $2^{N-2}$ dB by the (N−1)-th attenuation resistor circuit $1_{N-1}$ to the attenuation amount of $2^{N-1}$ dB by the N-th attenuation resistor circuit $1_N$ by the same step width, and each of the $(2^{N-2}-1)$ adjustment resistor circuits 2 corresponds to one combination of two or more combinations of two or more attenuation resistor circuits 1 up to the (N−1)-th attenuation resistor circuit $1_{N-1}$, the corresponding adjustment resistor circuit 2 is on-controlled by a signal of a logical product of a plurality of attenuation amount control signals corresponding to when the plurality of attenuation resistor circuits 1 is simultaneously on-controlled, and adjustment is performed in such a manner as that a sum of attenuation amounts when the plurality of attenuation resistor circuits 1 simultaneously on-controlled is equal to that of independently on-controlled, so that each of the m adjustment resistor circuits 2 is controlled by a signal of a logical product of an attenuation amount control signal for the attenuation resistor circuit 1 simultaneously on-controlled, and with a simple circuit configuration without providing a logic circuit for attenuation amount control, the attenuation amount can be changed stepwise in $[n+(2^n-1-n)]$ steps at equal intervals.

Further, since the circuit configuration is simple, it can be easily integrated on a GaAs substrate.

Third Embodiment

A variable attenuator according to a third embodiment will be described with reference to FIG. 3.

The variable attenuator according to the third embodiment is provided for a pair of signal lines $3a$ and $3b$ in contrast to the variable attenuator according to the first embodiment provided for the signal line 3.

Note that, in FIG. 3, the same reference signs as those in FIG. 1 denote the same or corresponding parts.

The variable attenuator according to the third embodiment is applied to a variable attenuator integrated on a gallium arsenide (GaAs) substrate.

The variable attenuator according to the third embodiment is a variable T-type attenuator having a plurality of attenuation amounts and having step widths of the plurality of attenuation amounts at equal intervals.

The variable attenuator according to the third embodiment has a most basic circuit configuration similarly to the variable attenuator according to the first embodiment, and has three attenuation amounts with equal step widths.

The adjustment resistor circuit 2 adjusts the sum of the attenuation amounts when the two attenuation resistor circuits $1_1$ and $1_2$ are simultaneously enabled to be equal to the sum of the attenuation amounts when the two attenuation resistor circuits $1_1$ and $1_2$ are enabled alone.

The two attenuation resistor circuits $1_1$ and $1_2$ and the adjustment resistor circuit 2 are connected in parallel between the signal line $3a$ connecting the input terminal IN1 and m output terminal OUT1 of one signal and the signal line $3b$ connecting the input terminal IN2 and the output terminal OUT2 of the other signal.

The first attenuation resistor circuit $1_1$ includes a switching unit $11_1$ and an attenuation resistor $12_1$ connected in series between the pair of signal lines $3a$ and $3b$.

The switching unit $11_1$ is on-off controlled by a first attenuation amount control signal input to a corresponding first control terminal $4_1$.

The switching unit $11_1$ includes a one-side switching unit a and an other-side switching unit b with the attenuation resistor $12_1$ interposed therebetween.

The one-side switching unit a and the other-side switching unit b are N-MOS transistors that are switching elements.

The first attenuation amount control signal is input to a gate electrode of each of the MOS transistors constituting the one-side switching unit a and the other-side switching unit b, and on-off controlled by the first attenuation amount control signal.

A drain electrode which is one main electrode of the MOS transistor constituting the one-side switching unit a is connected to one signal line $3a$, and a source electrode which is the other main electrode is connected to one end of the attenuation resistor $12_1$.

A drain electrode which is one main electrode of the MOS transistor constituting the other-side switching unit b is connected to the other signal line $3b$, and a source electrode which is the other main electrode is connected to the other end of the attenuation resistor $12_1$.

The first attenuation resistor circuit $1_1$ can be regarded as a kind of differential circuit, and an axis of line symmetry of the differential circuit, on the line A-A in FIG. 3, can be virtually regarded as ground.

Therefore, when the MOS transistors constituting the one-side switching unit a and the other-side switching unit b are simultaneously turned on, the attenuation resistor $12_1$ is enabled, and a state in which one end of the attenuation resistor $12_1$ is connected to the one signal line $3a$ and a state in which the other end of the attenuation resistor $12_1$ is connected to the other signal line $3b$ are obtained.

As a result, a level of a signal transmitted to the one signal line $3a$ is attenuated by 1 dB in this example, and a level of a signal transmitted to the other signal line $3b$ is attenuated by 1 dB in this example.

The second attenuation resistor circuit $1_2$ includes a switching unit $11_2$ and an attenuation resistor $12_2$ connected in series between the pair of signal lines $3a$ and $3b$.

The switching unit $11_2$ is on-off controlled by the second attenuation amount control signal input to the corresponding second control terminal $4_2$.

The switching unit $11_2$ includes the one-side switching unit a and the other-side switching unit b with the attenuation resistor $12_2$ interposed therebetween.

The one-side switching unit a and the other-side switching unit b are N-MOS transistors that are switching elements.

The second attenuation amount control signal is input to a gate electrode of each of the MOS transistors constituting the one-side switching unit a and the other-side switching unit b, and on-off controlled by the second attenuation amount control signal.

A drain electrode which is one main electrode of the MOS transistor constituting the one-side switching unit a is connected to the one signal line $3a$, and a source electrode which is the other main electrode is connected to one end of the attenuation resistor $12_2$.

A drain electrode which is one main electrode of the MOS transistor constituting the other-side switching unit b is connected to the other signal line $3b$, and a source electrode which is the other main electrode is connected to the other end of the attenuation resistor $12_2$.

The second attenuation resistor circuit $1_2$ can be regarded as a kind of differential circuit, and an axis of line symmetry of the differential circuit, on the line A-A in FIG. 3, can be virtually regarded as ground.

Therefore, when the MOS transistors constituting the one-side switching unit a and the other-side switching unit b are simultaneously turned on, the attenuation resistor 122 is enabled, and a state in which one end of the attenuation resistor $12_2$ is connected to the one signal line $3a$ and a state in which the other end of the attenuation resistor $12_2$ is connected to the other signal line $3b$ are obtained.

As a result, since n is 2 in this example, the level of the signal transmitted to the one signal line $3a$ is attenuated by the attenuation amount of ($2^{n-1}$) dB, that is, 2 times in decibel notation which is, 2 dB with respect to the attenuation amount for the one signal line by the first attenuation resistor circuit $1_1$, and the level of the signal transmitted to the other signal line $3b$ is attenuated by 2 times in decibel notation, that is, 2 dB with respect to the attenuation amount for the other signal line by the first attenuation resistor circuit $1_1$ in this example.

When the attenuation resistor $12_1$ and the attenuation resistor $12_2$ are enabled, the adjustment resistor circuit 2 performs attenuation amount adjustment in such a manner as to be equal to the sum of the attenuation amounts when the attenuation resistor $12_1$ and the attenuation resistor $12_2$ are enabled alone.

When the attenuation resistor $12_1$ and the attenuation resistor $12_2$ are enabled at the same time, since the attenuation resistor $12_1$ and the attenuation resistor $12_2$ are connected in parallel, attenuation of 3 dB (=1 dB+2 dB), which is the sum of both attenuation amounts, cannot be simply obtained, and the level of the signal transmitted to the signal lines $3a$ and $3b$ is attenuation of less than 3 dB.

The adjustment resistor circuit 2 is a circuit that adjusts the signal lines $3a$ and $3b$ to 3 dB when the attenuation resistor $12_1$ and the attenuation resistor $12_2$ are enabled at the same time.

The adjustment resistor circuit 2 includes a switching unit 21 and an adjustment resistor 22 connected in series between the pair of signal lines $3a$ and $3b$.

The switching unit 21 is on-off controlled by a signal of a logical product of the first attenuation amount control signal and the second attenuation amount control signal input to the attenuation resistor circuits $1_1$ and $1_2$ that are enabled at the same time.

That is, the switching unit 21 is in a conductive state when both the first attenuation amount control signal and the second attenuation amount control signal are "1", that is, turned on, and is in a non-conductive state when at least one of the first attenuation amount control signal or the second attenuation amount control signal is "0", that is, turned off.

The switching unit 21 includes a one-side switching unit a and an other-side switching unit b with the adjustment resistor 22 interposed therebetween.

The one-side switching unit a and the other-side switching unit b include N-MOS transistors that are switching elements, and the number of MOS transistors in each of the one-side switching unit a and the other-side switching unit b is half the number of the attenuation resistor circuits $1_1$ and $1_2$ that are enabled at the same time.

In the present example, the one-side switching unit a is a MOS transistor in which the first attenuation amount control signal is input to the gate electrode, and the other-side switching unit b is a MOS transistor in which the second attenuation amount control signal is input to the gate electrode.

Therefore, when both the first attenuation amount control signal and the second attenuation amount control signal are "1", the adjustment resistor 22 is enabled, and when at least one of the first attenuation amount control signal or the second attenuation amount control signal is "0", the adjustment resistor 22 is not enabled.

A drain electrode which is one main electrode of the MOS transistor constituting the one-side switching unit a is connected to the one signal line $3a$, and a source electrode which is the other main electrode is connected to one end of the adjustment resistor 22.

A drain electrode which is one main electrode of the MOS transistor constituting the other-side switching unit b is connected to the other signal line $3b$, and a source electrode which is the other main electrode is connected to the other end of the adjustment resistor 22.

The adjustment resistor circuit 2 can be regarded as a kind of differential circuit, and an axis of line symmetry of the differential circuit, on the line A-A in FIG. 3, can be virtually regarded as ground.

Therefore, when the MOS transistors constituting the one-side switching unit a and the other-side switching unit b are simultaneously turned on, the adjustment resistor 22 is enabled, and a state in which one end of the adjustment resistor 22 is connected to the one signal line $3a$ and a state in which the other end of the adjustment resistor 22 is connected to the other signal line $3b$ are obtained.

As a result, the adjustment resistor 22 attenuates the level of the signal transmitted to the one signal line $3a$ by the attenuation resistor $12_1$ and the attenuation resistor $12_2$ connected to the one signal line $3a$ by an attenuation amount equal to the sum of the attenuation amounts when the attenuation resistor $12_1$ and the attenuation resistor $12_2$ are enabled alone, that is, 3 dB in this example.

The adjustment resistor 22 attenuates the level of the signal transmitted to the other signal line 3b by 3 dB in this example by the attenuation resistor $12_1$ and the attenuation resistor $12_2$ connected to the other signal line 3b.

In short, when the attenuation resistor $12_1$ and the attenuation resistor $12_2$ are enabled by being controlled by the first attenuation amount control signal and the second attenuation amount control signal, the resistance value of the adjustment resistor 22 is adjusted to be equal to the sum of the attenuation amounts when the attenuation resistor $12_1$ and the attenuation resistor $12_2$ are enabled alone, and as a result, the attenuation amount is set to a resistance value at which the attenuation amount is set at equal intervals.

That is, in the variable attenuator according to the third embodiment, the level of the signal transmitted to the signal line 3a and the signal line 3b can be changed stepwise in three steps with the step width of the attenuation amount at equal intervals.

A first attenuation amount control signal is input from the control unit 5 to the first control terminal $4_1$.

A second attenuation amount control signal is input from the control unit 5 to the second control terminal $4_2$.

Note that the transistor constituting each switching unit may be a P-MOS transistor instead of an N-MOS transistor. In the case of the P-MOS transistor, the relationship between the high level and the low level of each attenuation amount control signal with respect to the on-off control is reversed.

Next, the operation of the variable attenuator according to the third embodiment will be described.

As a first operation mode, a case where the first attenuation amount control signal input from the control unit 5 to the first control terminal $4_1$ is "1" and the second attenuation amount control signal input to the second control terminal $4_2$ is "0" will be described.

The first operation mode is an operation mode in which the variable attenuator attenuates the level of the signal transmitted to the signal line 3a and the signal line 3b by 1 dB.

Note that, since the signal line 3b is similar to the signal line 3a, the signal line 3a will be described below.

When the first attenuation amount control signal is "1", the two MOS transistors constituting the switching unit $11_1$ are turned on, and when the second attenuation amount control signal is "0", the two MOS transistors constituting the switching unit $11_2$ and the MOS transistor constituting the one-side switching unit a in the switching unit 21 are turned off.

As a result, only the attenuation resistor $12_1$ is enabled for the signal line 3a, and the attenuation resistor $12_2$ and the adjustment resistor 22 are not enabled for the signal line 3a. As a result, the level of the signal transmitted to the signal line 3a is attenuated by 1 dB in this example.

As a second operation mode, a case where the first attenuation amount control signal input from the control unit 5 to the first control terminal $4_1$ is "0" and the second attenuation amount control signal input to the second control terminal $4_2$ is "1" will be described.

The second operation mode is an operation mode in which the variable attenuator attenuates the level of the signal transmitted to the signal line 3a by 2 dB.

When the second attenuation amount control signal is "1", the two MOS transistors constituting the switching unit $11_2$ are turned on, and when the first attenuation amount control signal is "0", the two MOS transistors constituting the switching unit $11_1$ and the MOS transistor constituting the other-side switching unit b in the switching unit 21 are turned off.

As a result, only the attenuation resistor $12_2$ is enabled for the signal line 3a, and the attenuation resistor $12_1$ and the adjustment resistor 22 are not enabled for the signal line 3a. As a result, the level of the signal transmitted to the signal line 3a is attenuated by 2 dB in this example.

As a third operation mode, a case where the first attenuation amount control signal input from the control unit 5 to the first control terminal $4_1$ is "1" and the second attenuation amount control signal input to the second control terminal $4_2$ is "1" will be described.

The third operation mode is an operation mode in which the variable attenuator attenuates the level of the signal transmitted to the signal line 3 by 3 dB.

When the first attenuation amount control signal is "1" and the second attenuation amount control signal is "1", the two MOS transistors constituting the switching unit $11_1$, the two MOS transistors constituting the switching unit $11_2$, and the two MOS transistors constituting the switching unit 21 are turned on.

As a result, the attenuation resistor $12_1$, the attenuation resistor $12_2$, and the adjustment resistor 22 are enabled in the signal line 3a, and the level of the signal transmitted to the signal line 3a is attenuated by 3 dB in this example.

That is, the level of the signal transmitted to the signal line 3a is attenuated by an attenuation amount of 1 dB in the first operation mode, an attenuation amount of 2 dB having a step width of 1 dB with respect to the first operation mode in the second operation mode, and an attenuation amount of 3 dB having a step width of 1 dB with respect to the second operation mode in the third operation mode.

In short, the variable attenuator according to the third embodiment is controlled by the first attenuation amount control signal and the second attenuation amount control signal to achieve an attenuation amount at equal intervals with a step width of 1 dB from 1 dB to 3 dB.

As described above, the variable attenuator according to the third embodiment includes the two attenuation resistor circuits $1_1$ and $1_2$ and the one adjustment resistor circuit 2 connected in parallel to the pair of signal lines 3a and 3b, the two attenuation resistor circuits $1_1$ and $1_2$ are on-off controlled by the respective corresponding first attenuation amount control signal and second attenuation amount control signal, the adjustment resistor circuit 2 is on-off controlled by a signal of a logical product of the first attenuation amount control signal and the second attenuation amount control signal, and the sum of the attenuation amounts when the attenuation resistors $12_1$ and $12_2$ in the two attenuation resistor circuits $1_1$ and $1_2$ are enabled is adjusted, so that the step width of the attenuation amount can be changed stepwise in three steps at equal intervals by a simple circuit configuration without providing a logic circuit for the attenuation amount control.

Further, the adjustment resistor circuit 2 is configured to include the switching unit 21 and the adjustment resistor 22 connected in series between the pair of signal lines 3a and 3b, the switching unit 21 includes the one-side switching unit a and the other-side switching unit b with the adjustment resistor 22 interposed therebetween, the one-side switching unit a is on-off controlled by the second attenuation amount control signal, and the other-side switching unit b is on-off controlled by the first attenuation amount control signal, and thus can be configured by a half of the number of switching units with respect to the signal lines 3a and 3b.

Furthermore, since the circuit configuration is simple, it can be easily integrated on a GaAs substrate.

Fourth Embodiment

A variable attenuator according to a fourth embodiment will be described with reference to FIG. 4.

Figure 4:
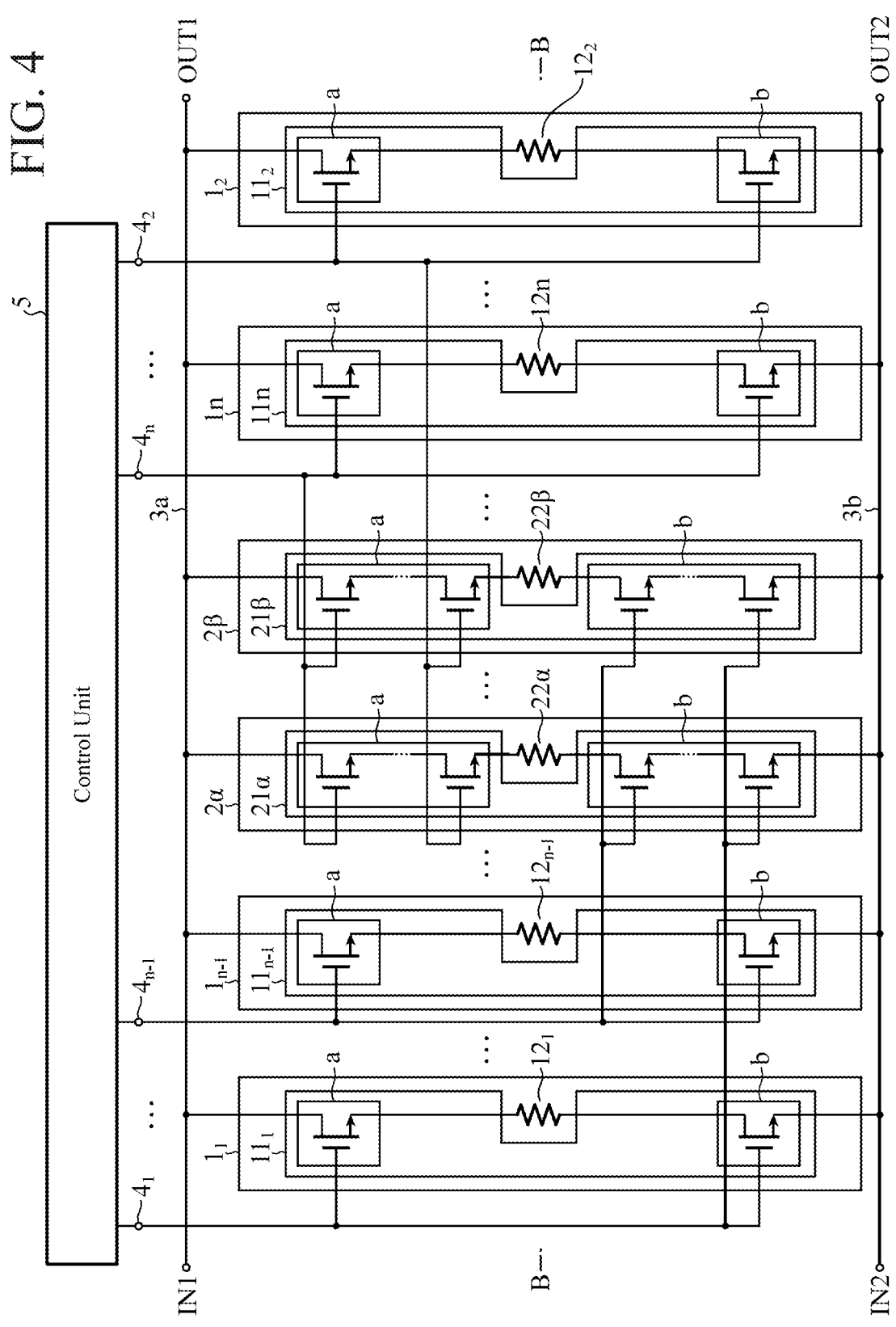
FIG. 4 is a schematic circuit diagram illustrating a variable attenuator according to a fourth embodiment.

In FIG. 4, the same reference signs as those attached in FIGS. 1 to 4 denote the same or corresponding parts.

The variable attenuator according to the fourth embodiment is applied to a variable attenuator integrated on a gallium arsenide (GaAs) substrate.

A variable attenuator according to the fourth embodiment is a variable T-type attenuator having a plurality of attenuation amounts and having step widths of the plurality of attenuation amounts at equal intervals.

The variable attenuator according to the fourth embodiment has a circuit configuration similar to that of the variable attenuator according to the second embodiment, and moreover has a most basic circuit configuration that is similar to that of the variable attenuator according to the third embodiment, and has $[n+(2^n-1-n)]$ attenuation amounts with equal step widths.

The variable attenuator according to the fourth embodiment includes n attenuation resistor circuits $1_1$ to $1_n$, n being natural numbers equal to or more than 2 and m, which is $(2^n-1-n)$, adjustment resistor circuits $2_1$ to $2_m$ which are connected in parallel between a pair of signal lines 3a and 3b.

The signal line 3a is a signal line connecting the input terminal IN1 and the output terminal OUT1, and the signal line 3b is a signal line connecting the input terminal IN2 and the output terminal OUT2.

In the n attenuation resistor circuits $1_1$ to $1_n$, an N-th (N is a natural number from 1 to n) attenuation resistor circuit IN attenuates an attenuation amount of $2^{N-1}$ dB as a level of a signal transmitted to each of the pair of signal lines 3a and 3b.

In the present disclosure, the attenuation amount of $2^{N-1}$ dB includes a technical range obtained by multiplying $2^{N-1}$ by the coefficient α, and the coefficient will be described as 1 because it is complicated for description.

Each of the m adjustment resistor circuits $2_1$ to $2m$ corresponds to a plurality of attenuation resistor circuits selected among the n attenuation resistor circuits $1_1$ to $1_n$, and adjusts the sum of the attenuation amounts when the selected plurality of attenuation resistor circuits is enabled simultaneously to be equal to the sum of the attenuation amounts when the selected plurality of attenuation resistor circuits is enabled alone.

Note that, in the following description, when content common to the attenuation resistor circuits is described in the n attenuation resistor circuits $1_1$ to $1_n$, the description will be simply given as the attenuation resistor circuit 1 without adding a subscript, in order to avoid complication of the description.

Further, when content common to the adjustment resistor circuits is described in the m adjustment resistor circuits $2_1$ to $2_m$, the description will be simply given as the adjustment resistor circuit 2 without adding a subscript, in order to avoid complication of the description.

Note that, in FIG. 4, four attenuation resistor circuits ($1_1$, $1_2$, $1_{n-1}$, and $1_n$) and two adjustment resistor circuits (2α and 2β) are exemplarily illustrated because the drawing becomes complicated.

As an example, the variable attenuator according to the fourth embodiment is a variable attenuator in which the step width is equal to 1 dB with respect to each of the signal line 3a and the signal line 3b, and the number of changes in the attenuation amount is $[n+(2^n-1-n)]$.

The step width is given as an example, and is not limited to the example.

Each attenuation resistor circuit 1 includes a switching unit 11 and an attenuation resistor 12 connected in series between the pair of signal lines 3a and 3b.

The switching unit 11 is on-off controlled by a corresponding attenuation amount control signal input to the corresponding control terminal 4.

The switching unit 11 includes a one-side switching unit a and an other-side switching unit b with the attenuation resistor 12 interposed therebetween.

Each attenuation amount control signal is a binary signal indicating "1" (high level) or "0" (low level).

The one-side switching unit a and the other-side switching unit b are N-MOS transistors that are switching elements.

An attenuation amount control signal corresponding to a gate electrode is input to the MOS transistors constituting the one-side switching unit a and the other-side switching unit b, and on-off controlled by the corresponding attenuation amount control signal.

A drain electrode which is one main electrode of the MOS transistor constituting the one-side switching unit a is connected to the one signal line 3a, and a source electrode which is the other main electrode is connected to one end of the attenuation resistor 12.

A drain electrode which is one main electrode of the MOS transistor constituting the other-side switching unit b is connected to the other signal line 3b, and a source electrode which is the other main electrode is connected to the other end of the attenuation resistor 12.

The attenuation resistor circuit 1 can be regarded as a kind of differential circuit, and an axis of line symmetry of the differential circuit, on the line B-B in FIG. 4, can be virtually regarded as ground.

Therefore, when the MOS transistors constituting the one-side switching unit a and the other-side switching unit b are simultaneously turned on, the attenuation resistor 12 is enabled, and a state in which one end of the attenuation resistor 12 is connected to the one signal line 3a and a state in which the other end of the attenuation resistor 12 is connected to the other signal line 3b are obtained.

As a result, each attenuation resistor circuit 1 can attenuate the level of the signal transmitted to the one signal line 3a by $2^{N-1}$ dB in this example, and attenuate the level of the signal transmitted to the other signal line 3a by $2^{N-1}$ dB in this example.

That is, when the attenuation resistor 12 is enabled independently, the first attenuation resistor circuit $1_1$ to the n-th attenuation resistor circuit $1_n$ attenuate levels of signals transmitted to each of the pair of signal lines 3a and 3b by attenuation amounts of 1 dB, 2 dB, 4 dB, 8 dB, . . . , $2^{n-1}$ dB in this order.

Each adjustment resistor circuit 2 corresponds to k attenuation resistor circuits 1 selected from the n attenuation resistor circuits 1, and is on-off controlled by a signal of a logical product of k attenuation amount control signals for on-off control corresponding to each of the selected k attenuation resistor circuits 1.

When being on-controlled by a signal of a logical product of k attenuation amount control signals, attenuation amount of the adjustment resistor circuits 2 are made to be equal to the sum of attenuation amounts when the k attenuation resistor circuits 1 controlled by the corresponding k attenuation amount control signals are independently on-controlled together with the attenuation amounts of the k attenuation resistor circuits 1 simultaneously on-controlled by the corresponding k attenuation amount control signals.

$(2^{N-2}-1)$ adjustment resistor circuits 2 are provided to adjust an attenuation amount from an attenuation amount of $2^{N-2}$ dB by the (N−1)-th attenuation resistor circuit 1 to an attenuation amount of $2^{N-1}$ dB by the N-th attenuation resistor circuit by using the same step width.

Each of the $(2^{N-2}-1)$ adjustment resistor circuits 2 corresponds to one combination of two or more combinations of two or more attenuation resistor circuits 1 up to the N-th attenuation resistor circuit $\mathbf{1}_N$.

The relationship between the m adjustment resistor circuits $\mathbf{2}_1$ to $\mathbf{2}_m$ and the n attenuation resistor circuits $\mathbf{1}_1$ to $\mathbf{1}_n$ is the same as the relationship between the m adjustment resistor circuits $\mathbf{2}_1$ to $\mathbf{2}_m$ and the n attenuation resistor circuits $\mathbf{1}_1$ to $\mathbf{1}_n$ in the variable attenuator according to the second embodiment.

As a result, the attenuation amount between the attenuation amount of $2^{N-2}$ dB when the (N−1)-th attenuation resistor circuit is enabled alone and the attenuation amount of $2^{N-1}$ dB when the N-th attenuation resistor circuit is enabled alone is adjusted by the adjustment resistor circuit in such a manner as to obtain an attenuation amount at equal intervals with the same width in step.

Each adjustment resistor circuit 2 includes a switching unit 21 and an attenuation resistor 22 connected in series between the signal line 3a and the signal line 3b.

The switching unit 21 in each adjustment resistor circuit 2 corresponds to the k attenuation resistor circuits 1 selected from the n attenuation resistor circuits 1, and is on-off controlled by a signal of a logical product of k attenuation amount control signals for on-off control corresponding to each of the selected k attenuation resistor circuits 1.

When the k attenuation amount control signals for the corresponding selected k attenuation resistor circuits 1 are both "1", the switching unit 21 is in a conductive state between the signal line 3a and the signal line 3b, that is, turned on, and when at least one of the k attenuation amount control signals is "0", the switching unit is in a non-conductive state between the signal line 3a and the signal line 3b, that is, turned off.

The switching unit 21 includes a one-side switching unit a and an other-side switching unit b with the attenuation resistor 22 interposed therebetween.

The one-side switching unit a is on-off controlled by a signal of a logical product of attenuation amount control signals for a half of the k attenuation resistor circuits selected.

The other-side switching unit b is on-off controlled by a signal of a logical product of attenuation amount control signals for the remaining half of the k attenuation resistor circuits selected.

When k is an even number, the one-side switching unit a is on-off controlled by a signal of a logical product of attenuation amount control signals of k/2 which is a half, and the other-side switching unit b is on-off controlled by a signal of a logical product of attenuation amount control signals of k/2 which is the remaining half.

When k is an odd number, the one-side switching unit a is on-off controlled by a signal of a logical product of attenuation amount control signals of (k+1)/2 meaning a half in the present disclosure, and the other-side switching unit b is on-off controlled by a signal of a logical product of attenuation amount control signals of (k+1)/2 meaning the remaining half in the present disclosure.

When k is an odd number, one of the attenuation amount control signals for the k attenuation resistor circuits constitutes a signal of a logical product for both the one-side switching unit a and the other-side switching unit b.

Even if k is an odd number, the number of attenuation amount control signals input to each adjustment resistor circuit is the number k of attenuation amount control signals for the selected k attenuation resistor circuits 1.

In the present disclosure, the half includes k/2 and (k+1)/2, both the half and the remaining half are k/2 when k is an even number, and when k is an odd number, the half and the remaining half are (k+1)/2 in which one attenuation amount control signal overlaps.

The one-side switching unit a in the switching unit 21 includes a series body in which N-MOS transistors, which are a half of the k switching elements, are connected in series in such a manner as to correspond to a half of the selected k attenuation resistor circuits.

The other-side switching unit b in the switching unit 21 includes a series body in which N-MOS transistors, which are the remaining half of the k switching elements, are connected in series corresponding to the remaining half of the selected k attenuation resistor circuits.

When k is an odd number, the number of MOS transistors constituting the series body in each of the one-side switching unit a and the other-side switching unit b is (k+1)/2, and the one-side switching unit a and the other-side switching unit b include one MOS transistor connected to the same control terminal 4 and having the same attenuation amount control signal connected to the gate electrode.

With this configuration, under the condition that the attenuation resistor 12 is enabled, the attenuation resistor 12 is connected to both the signal line 3a and the signal line 3b in a well-balanced manner.

Note that, when the number k of the selected attenuation resistor circuits is an odd number, the number k of the MOS transistors is a natural number of 2 to n+1, but in the following description, since it becomes complicated if the number is divided into an even number and an odd number, the number of (k+1) MOS transistors in the odd number is also assumed to be k.

Since each adjustment resistor circuit 2 corresponds to one combination of two or more combinations selected from the n attenuation resistor circuits 1, the number k of MOS transistors is a natural number from 2 to n (n+1 in the case of an odd number) corresponding to the selected two or more combinations.

That is, in the m adjustment resistor circuits 2, the switching unit 21 can be classified by a group of 2 MOS transistors, a group of 3 MOS transistors, . . . , n MOS transistors, and the number of MOS transistors.

Then, the one-side switching unit a is a half of the number k of MOS transistors based on the selected combination of two or more.

Further, the other-side switching unit b is the remaining half of the number k of MOS transistors based on the selected combination of two or more.

For example, like the first adjustment resistor circuit $\mathbf{2}_1$ for adjusting the attenuation amount of 3 dB includes one MOS transistor for each of the one-side switching unit a and the other-side switching unit b, the second adjustment resistor circuit $\mathbf{2}_2$ for adjusting the attenuation amount of 5 dB includes one MOS transistor for each of the one-side switching unit a and the other-side switching unit b, the third adjustment resistor circuit $\mathbf{2}_3$ for adjusting the attenuation amount of 6 dB includes one MOS transistor for each of the one-side switching unit a and the other-side switching unit b, the fourth adjustment resistor circuit $\mathbf{2}_4$ for adjusting the attenuation amount of 7 dB includes two MOS transistors for each of the one-side switching unit a and the other-side switching unit b (the gate electrode of one MOS transistor is connected to the same control terminal 4), . . . , the adjustment resistor circuit 2 includes a series body of the number of MOS transistors based on the combination of the attenuation resistor circuit 1 that is simultaneously on-controlled, and in the m-th adjustment resistor circuit $2_m$, each of the one-side switching unit a and the other-side switching unit b is formed by a series body of half n MOS transistors.

In each adjustment resistor circuit 2, one end of a series body including a half of the k MOS transistors constituting the one-side switching unit a of the switching unit 21, that is, a drain electrode of the MOS transistor on the side of the one signal line 3a is connected to the one signal line 3a, and the other end of the series body, that is, a source electrode of the MOS transistor on the opposite side of the one signal line 3a is connected to one end of the adjustment resistor 22. The gate electrode of each MOS transistor is connected to the control terminal 4 to which the corresponding selected attenuation resistor circuit 1 is connected.

Note that, in each adjustment resistor circuit 2, one end of a series body including a remaining half of the k MOS transistors constituting the other-side switching unit b of the switching unit 21, that is, the drain electrode of the MOS transistor on the other signal line 3b side is connected to the other signal line 3b, and the other end of the series body, that is, the source electrode of the MOS transistor on the opposite side of the other signal line 3b is connected to the other end of the adjustment resistor 22. The gate electrode of each MOS transistor is connected to the control terminal 4 to which the corresponding selected attenuation resistor circuit 1 is connected.

In the adjustment resistor 22, when all the k MOS transistors constituting the switching unit 21 are turned on, that is, when the one-side switching unit a and the other-side switching unit b of the switching unit 21 are in a conductive state, the one signal line 3a and the other signal line 3b are in a conductive state.

At this time, the MOS transistors 11 of the k attenuation resistor circuits 1 corresponding to the adjustment resistor circuit 2 are turned on, and the attenuation resistor 12 is connected to the one signal line 3a and the other signal line 3b.

In other words, only when all the MOS transistors constituting the switching units 11 of the k attenuation resistor circuits 1 are turned on and all the attenuation resistors 12 of the k attenuation resistor circuits 1 are connected to the one signal line 3a and the other signal line 3b, the adjustment resistor 22 is connected to the one signal line 3a and the other signal line 3b.

The resistance value of each adjustment resistor 22 is set to a resistance value that attenuates the attenuation amount for each of the pair of signal lines 3a and 3b, which is equal to the sum of the attenuation amounts when the k attenuation resistors 12 in the corresponding k attenuation resistor circuits 1 are enabled alone for each of the pair of signal lines 3a and 3b when the attenuation resistors 12 are enabled at the same time.

As a result, in the variable attenuator according to the fourth embodiment, the level of the signal transmitted to each of the pair of signal lines 3a and 3b can be changed stepwise in $[n+(2^n-1-n)]$ steps with the step width of the attenuation amount at equal intervals.

Next, the operation of the variable attenuator according to the fourth embodiment will be described.

Since the operation of the variable attenuator according to the fourth embodiment is substantially the same as the operation of the variable attenuator according to the second embodiment, the description thereof will be omitted.

That is, in a case where the attenuation resistor circuit 1 is selected depending on the attenuation amount, and in a case where the plurality of attenuation resistor circuits 1 is enabled simultaneously, the adjustment resistor circuit 2 corresponding to the selected attenuation resistor circuit 1 is enabled, and in a case where the attenuation amount is $[n+(2^n-1-n)]$ dB, all of the first attenuation resistor circuit $1_1$ to the n-th attenuation resistor circuits $1_n$ and the m-th adjustment resistor circuit $2_m$ are enabled.

In short, the variable attenuator according to the fourth embodiment is controlled by the first attenuation amount control signal to the n-th attenuation amount control signal, and implements an attenuation amount at equal intervals with a step width of 1 dB from 1 dB to $[n+(2^n-1-n)]$ dB.

As described above, the variable attenuator according to the fourth embodiment includes the n attenuation resistor circuits $1_1$ to $1_n$ and the m adjustment resistor circuits $2_1$ to $2_m$, the n attenuation resistor circuits $1_1$ to $1_n$ are on-off controlled by the respective corresponding first attenuation amount control signal to the n-th attenuation amount control signal, the attenuation amount for each of the pair of signal lines 3a and 3b when each of the attenuation resistor circuits $1_1$ to $1_n$ is independently on-controlled is $2^{N-1}$ (N is 1 to n) dB, the m adjustment resistor circuits 2 include the $(2^{N-2}-1)$ adjustment resistor circuits that adjust an attenuation amount from an attenuation amount of $2^{N-2}$ dB by the (N–1)-th attenuation resistor circuit $1_{N-1}$ to an attenuation amount of $2^{N-1}$ dB by the N-th attenuation resistor circuit $1_N$ on each of the pair of signal lines 3a and 3b by the same step width, each of the $(2^{N-2}-1)$ adjustment resistor circuits 2 corresponds to one combination among two or more combinations of two or more attenuation resistor circuits up to the (N–1)-th attenuation resistor circuit, a one-side switching unit a in each of the adjustment resistor circuits 2 is on-controlled by a signal of a logical product of an attenuation amount control signal for a half of the attenuation resistor circuits 1 of the plurality of attenuation resistor circuits 1 corresponding to the combination, the other-side switching unit b is on-controlled by the signal of the logical product of the attenuation amount control signals for the remaining half of the plurality of attenuation resistor circuits 1 corresponding to the combination, and adjustment is performed in such a manner as that the sum of the attenuation amounts when the plurality of attenuation resistor circuits 1 simultaneously on-controlled is equal to that of independently on-controlled, so that each of the m adjustment resistor circuits 2 is controlled by the signal of the logical product of the attenuation amount control signal for the attenuation resistor circuits 1 to be simultaneously on-controlled at the same time, and with a simple circuit configuration without providing a logic circuit for attenuation amount control, the step width of the attenuation amount can be changed stepwise in $[n+(2^n-1-n)]$ steps at equal intervals for each of the pair of signal lines 3a and 3b.

Further, each of the adjustment resistor circuits 2 includes, between the pair of signal lines 3a and 3b, a switching unit 21 having a one-side switching unit a and an other-side switching unit b with the adjustment resistor 22 and the adjustment resistor 22 interposed therebetween, the one-side switching unit a is a series body including a half of the k MOS transistors in which corresponding attenuation amount control signals in a corresponding half of the k attenuation amount control signals among the selected k attenuation amount control signals are input to the gate electrode, and the other-side switching unit b is a series body including a remaining half of the k MOS transistors in which corresponding attenuation amount control signals in a corresponding remaining half of the k attenuation amount control signals among the selected k attenuation amount control signals are input to the gate electrode, so that the number of MOS transistors constituting the switching unit b used in the adjustment resistor circuit can be halved with respect to those in which the variable attenuator is provided for each of the pair of signal lines 3a and 3b.

Furthermore, since the circuit configuration is simple, it can be easily integrated on a GaAs substrate.

Note that free combinations of the embodiments, modifications of any components of each embodiment, or omissions of any components in each embodiment are possible.

INDUSTRIAL APPLICABILITY

A variable attenuator according to the present disclosure is suitable for a variable attenuator integrated on a GaAs substrate.

REFERENCE SIGNS LIST $1_1$ to $1_n$: attenuation resistor circuit, $11_1$ to $11_n$: switching unit, $12_1$ to $12_n$: attenuation resistor, $2_1$ to $2_m$: adjustment resistor circuit, $21_1$ to $21_m$: switching unit, $22_1$ to $22_m$: adjustment resistor, 3, 3a, 3b: signal line, $4_1$ to $4_n$: control terminal, a: one-side switching unit, b: other-side switching unit

The invention claimed is:

1. A variable attenuator comprising
n attenuation resistor circuits and m adjustment resistor circuits connected in parallel to a signal line, wherein
the n attenuation resistor circuits are on-off controlled by corresponding attenuation amount control signals,
each of the n attenuation resistor circuits exhibits a different attenuation amount when being independently on-controlled,
the adjustment resistor circuits correspond to k attenuation resistor circuits selected from the n attenuation resistor circuits, and are on-off controlled by a signal of a logical product of k attenuation amount control signals for performing on-off control corresponding to each of the selected k attenuation resistor circuits, and
when being on-controlled by a signal of a logical product of the k attenuation amount control signals, attenuation amount of the adjustment resistor circuits are made equal to a sum of attenuation amounts when the k attenuation resistor circuits controlled by the corresponding k attenuation amount control signals are independently on-controlled together with a sum of attenuation amounts by the selected k attenuation resistor circuits simultaneously on-controlled by the corresponding k attenuation amount control signals.

2. The variable attenuator according to claim 1, wherein
the n is 2, the m is 1, and the k is 2,
an attenuation amount by a second attenuation resistor circuit of two of the attenuation resistor circuits when being independently on-controlled by a second attenuation amount control signal of two of the attenuation amount control signals is twice as large as an attenuation amount in decibel notation by a first attenuation resistor circuit of two of the attenuation resistor circuits when being independently on-controlled by a first attenuation amount control signal of the two of the attenuation amount control signals, and
when the first attenuation amount control signal and the second attenuation amount control signal cause the first attenuation resistor circuit and the second attenuation resistor circuit to be simultaneously on-controlled, the adjustment resistor circuit is on-controlled by a signal of a logical product of the first attenuation amount control signal and the second attenuation amount control signal, and adjusts an attenuation amount for the signal line to a step width that is same as a step width of an attenuation amount by the first attenuation resistor circuit and an attenuation amount by the second attenuation resistor circuit with respect to an attenuation amount by the second attenuation resistor circuit.

3. The variable attenuator according to claim 1, wherein
the n is a natural number equal to or more than 2, the m is $2^n-1-n$, and the k is n of 2 or more,
an attenuation amount when being independently on-controlled by a corresponding attenuation amount control signal in each of the n attenuation resistor circuits is $2^{N-1}$ (N is 1 to n) dB,
the m adjustment resistor circuits include ($2^{N-2}-1$) adjustment resistor circuits to adjust an attenuation amount from an attenuation amount of $2^{N-2}$ dB by the (N–1)-th attenuation resistor circuit to an attenuation amount of $2^{N-1}$ dB by the N-th attenuation resistor circuit by a same step width, and
each of the ($2^{N-2}-1$) adjustment resistor circuits corresponds to one combination of two or more combinations of two or more attenuation resistor circuits up to an (N–1)-th attenuation resistor circuit.

4. The variable attenuator according to claim 1, wherein
each of the n attenuation resistor circuits includes a switcher and an attenuation resistor that are on-off controlled by a corresponding attenuation amount control signal among the n attenuation amount control signals, and
each of the m adjustment resistor circuits includes a switcher and an adjustment resistor that are on-off controlled by a signal of a logical product of the selected k attenuation amount control signals.

5. The variable attenuator according to claim 4, wherein
in each of the attenuation resistor circuits, the switcher is a MOS transistor having a first main electrode connected to the signal line, a corresponding attenuation amount control signal among the n attenuation amount control signals is input to a gate electrode of the MOS transistor, and the attenuation resistor is connected between a second main electrode of the MOS transistor and a ground node, and
in each of the adjustment resistor circuits, the switcher is a series body including k MOS transistors having a first end connected to the signal line, a corresponding attenuation amount control signal among the selected k attenuation amount control signals is input to a gate electrode of each of MOS transistors, and the adjustment resistor is connected between a second end of the series body and the ground node.

6. The variable attenuator according to claim 1, wherein
the signal line is a pair of signal lines,
each of the attenuation resistor circuits includes a switcher and an attenuation resistor connected in series between the pair of signal lines, and the switcher includes a one-side switcher and an other-side switcher with the attenuation resistor interposed therebetween, the switcher being on-off controlled by a corresponding attenuation amount control signal, and
each of the adjustment resistor circuits includes a switcher and an adjustment resistor connected in series between the pair of signal lines, and the switcher includes a one-side switcher and an other-side switcher with the adjustment resistor interposed therebetween, the one-side switcher and the other-side switcher being on-off controlled by a signal of a logical product of corresponding selected k attenuation amount control signals.

7. The variable attenuator according to claim 6, wherein the n is 2, the m is 1, and the k is 2, an attenuation amount for a first signal line in the pair of signal lines by a second attenuation resistor circuit of two of the attenuation resistor circuits when being independently on-controlled by a second attenuation amount control signal of two of the attenuation amount control signals is twice as large as an attenuation amount in decibel notation for the first signal line in the pair of signal lines by a first attenuation resistor circuit of two of the attenuation resistor circuits when being independently on-controlled by a first attenuation amount control signal of the two of the attenuation amount control signals, and when the one-side switcher in the adjustment resistor circuit is on-off controlled by the second attenuation amount control signal, the other-side switcher is on-off controlled by the first attenuation amount control signal, and the first attenuation resistor circuit and the second attenuation resistor circuit are simultaneously on-controlled by the first attenuation amount control signal and the second attenuation amount control signal, and the attenuation amount for the first signal line in the pair of signal lines is adjusted to a same step width as a step width of the attenuation amount by the first attenuation resistor circuit and the attenuation amount by the second attenuation resistor circuit with respect to the attenuation amount by the second attenuation resistor circuit.

8. The variable attenuator according to claim 7, wherein in each of the first attenuation resistor circuit and the second attenuation resistor circuit, the one-side switcher is a MOS transistor connected between the first signal line in the pair of signal lines and a first end of the attenuation resistor and to which the first attenuation amount control signal or the second attenuation amount control signal corresponding to each of gate electrodes is input, and the other-side switcher is a MOS transistor that is connected between the second signal line in the pair of signal lines and a second end of the attenuation resistor, and to which the first attenuation amount control signal or the second attenuation amount control signal corresponding to each of gate electrodes is input, and in the adjustment resistor circuit, the one-side switcher is a MOS transistor connected between the first signal line in the pair of signal lines and a first end of the adjustment resistor, and in which the second attenuation amount control signal is input to a gate electrode, and the other-side switcher is a MOS transistor that is connected between the second signal line in the pair of signal lines and a second end of the adjustment resistor, and in which the first attenuation amount control signal is input to a gate electrode.

9. The variable attenuator according to claim 6, wherein the n is a natural number equal to or more than 2, the m is $2^n-1-n$, and the k is n of 2 or more, and an attenuation amount for the first signal line in the pair of signal lines when being independently on-controlled by a corresponding attenuation amount control signal in each of the n attenuation resistor circuits is $2^{N-1}$ (N is 1 to n) dB, the m adjustment resistor circuits include $(2^{N-2}-1)$ adjustment resistor circuits to adjust an attenuation amount from an attenuation amount of $2^{N-2}$ dB for the first signal line in the pair of signal lines by the (N−1)-th attenuation resistor circuit to an attenuation amount of $2^{N-1}$ dB for the first signal line in the pair of signal lines by the N-th attenuation resistor circuit by a same step width, each of the $(2^{N-2}-1)$ adjustment resistor circuits corresponds to one combination of two or more combinations of two or more attenuation resistor circuits up to an (N−1)-th attenuation resistor circuit, the one-side switcher in each of the adjustment resistor circuits is on-off controlled by a signal of a logical product of attenuation amount control signals for a half of a plurality of attenuation resistor circuits corresponding to the combination, and the other-side switcher in each of the adjustment resistor circuits is on-off controlled by a signal of a logical product of attenuation amount control signals for a remaining half of the plurality of attenuation resistor circuits corresponding to the combination.

10. The variable attenuator according to claim 9, wherein in each of the attenuation resistor circuits, the one-side switcher in the switcher is a MOS transistor in which a first main electrode is connected to the first signal line in the pair of signal lines, a corresponding attenuation amount control signal among the n attenuation amount control signals is input to a gate electrode of the MOS transistor, a second main electrode of the MOS transistor is connected to a first end of the corresponding attenuation resistor, the other-side switcher in the switcher is a MOS transistor in which a first main electrode is connected to a second signal line in the pair of signal lines, a corresponding attenuation amount control signal among the n attenuation amount control signals is input to a gate electrode of the MOS transistor, and the second main electrode of the MOS transistor is connected to a second end of the corresponding attenuation resistor, and in each of the adjustment resistor circuits, the one-side switcher of the switcher is a series body including a half of the k MOS transistors that each have a first end connected to the first signal line in the pair of signal lines and a second end connected to a first end of the adjustment resistor, and in which a corresponding attenuation amount control signal in a corresponding half of k attenuation amount control signals among the selected k attenuation amount control signals is input to a gate electrode, and the other-side switcher of the switcher is a series body including a remaining half of the k MOS transistors that each have a first end connected to the second signal line in the pair of signal lines and a second end connected to a second end of the adjustment resistor, and in which a corresponding attenuation amount control signal in a corresponding remaining half of the k attenuation amount control signals among the selected k attenuation amount control signals is input to a gate electrode.

11. The variable attenuator according to claim 9, wherein when the k is an odd number, the half and the remaining half mean (k+1)/2, and one of the half and the remaining half overlaps.

* * * * *